United States Patent [19]

Johnson

[11] 4,263,547

[45] Apr. 21, 1981

[54] TEST PROBE AND TERMINAL

[75] Inventor: Philmore E. Johnson, Bristol, Conn.

[73] Assignee: The Superior Electric Company, Bristol, Conn.

[21] Appl. No.: 904,367

[22] Filed: May 10, 1978

[51] Int. Cl.³ .......................... G01R 1/06; G01R 31/02
[52] U.S. Cl. .................................... 324/72.5; 324/149; 324/158 P; 339/108 TP
[58] Field of Search ................... 324/158 P, 72.5, 149; 339/108 TP, 33, 17 C

[56] References Cited

U.S. PATENT DOCUMENTS

| 2,516,657 | 7/1950 | Spendlove | 339/108 TP |
| 2,654,075 | 9/1953 | Gaborc | 324/72.5 |
| 2,969,519 | 1/1961 | Thomas | 324/72.5 |
| 3,910,665 | 10/1975 | Stull | 339/17 C |

FOREIGN PATENT DOCUMENTS

| 379720 | 9/1907 | France | 339/32 R |
| 748811 | 5/1956 | United Kingdom | 324/72.5 |

Primary Examiner—Ernest F. Karlsen

[57] ABSTRACT

A test probe for providing a releasable tensioned electrical connection to a selectable part or component of a printed circuit board by either hooking a wire or component lead with the probe end or inserting the probe end into an aperture of a test terminal.

8 Claims, 14 Drawing Figures

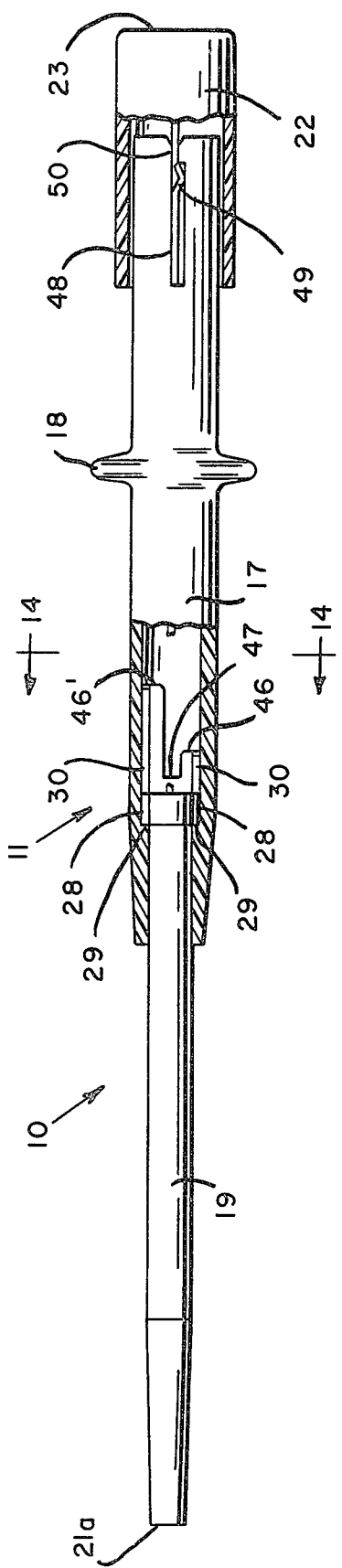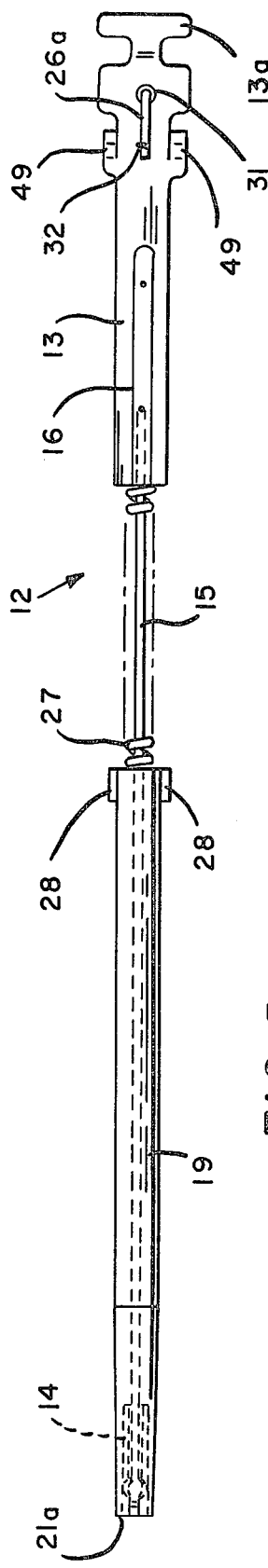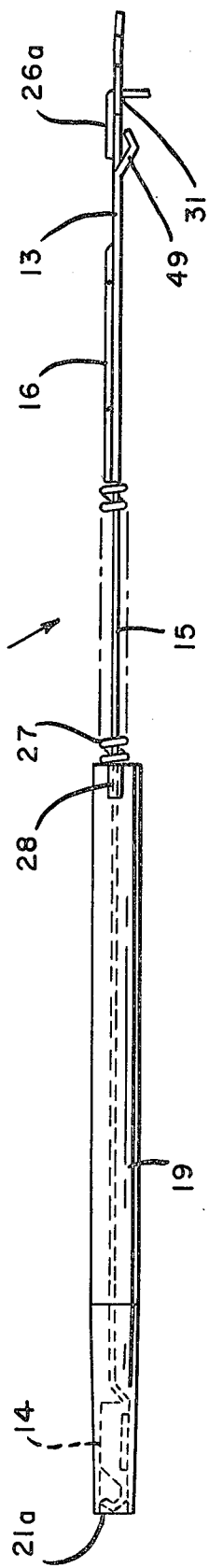
FIG. 4
FIG. 5
FIG. 6

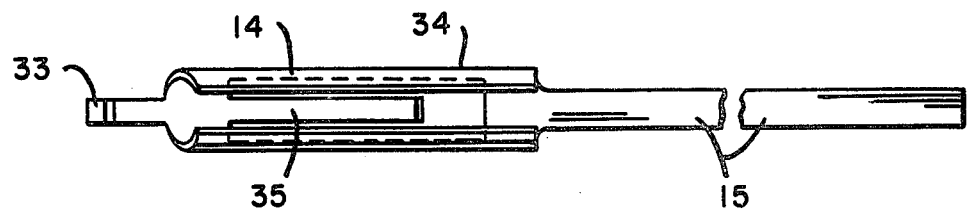
FIG. 7
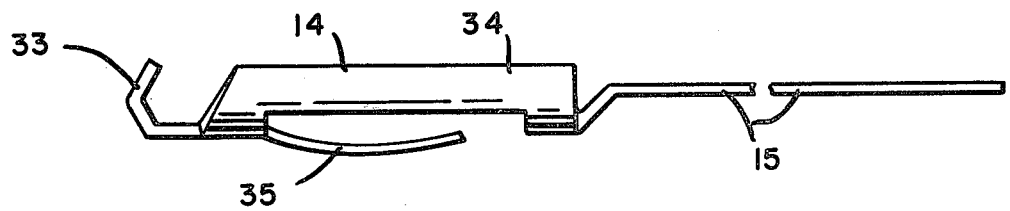
FIG. 8
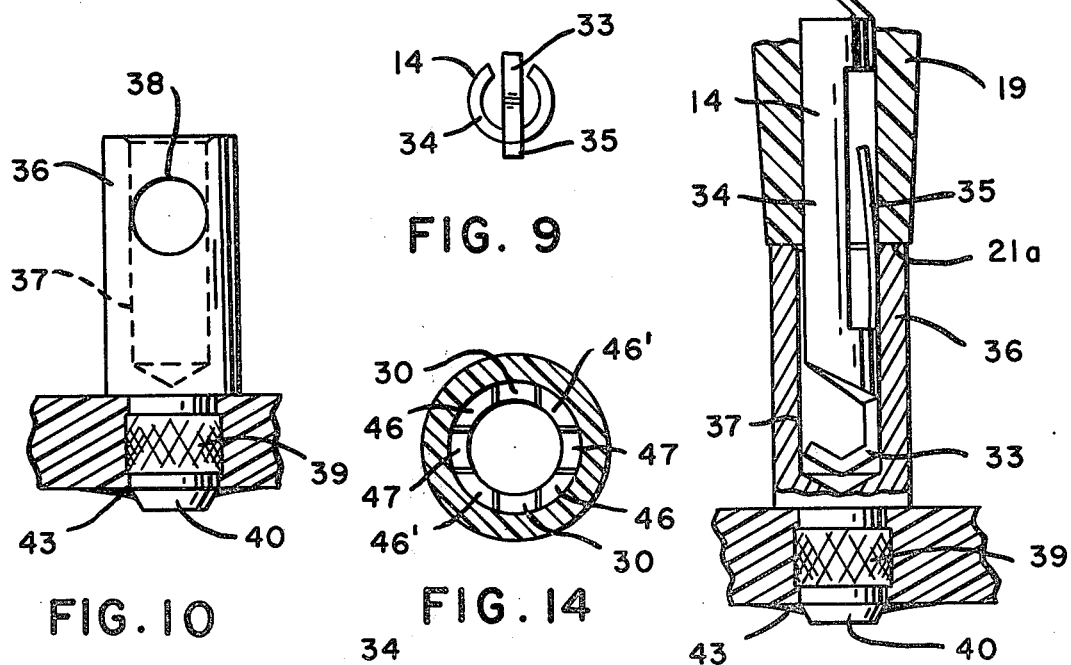
FIG. 9
FIG. 10
FIG. 14
FIG. 11
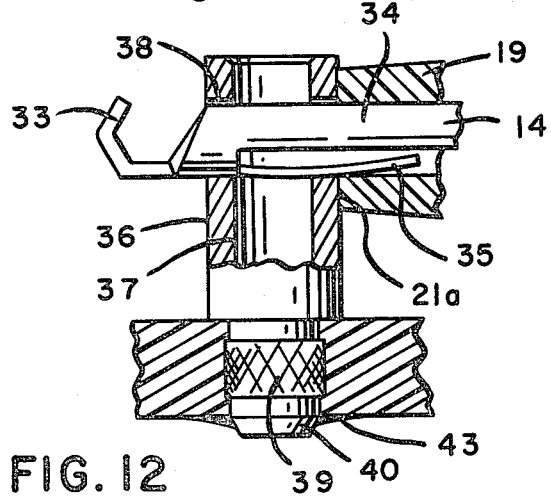
FIG. 12
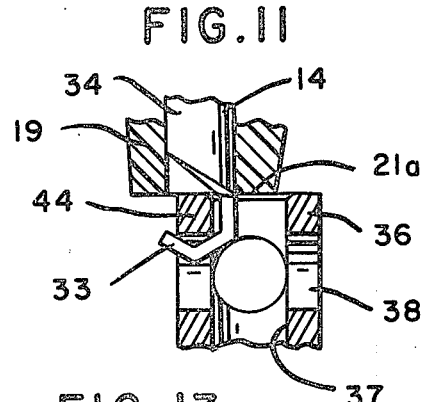
FIG. 13

TEST PROBE AND TERMINAL

When it is desired to electrically test a printed circuit board, one or more temporary electrical connections are made to selectable parts of the board whereat electrical measurements may be made. In the absence of edge terminals being provided on the board for test purposes, each connection is generally made by the use of a test probe having an end formed with a conducting hook with the hook being hooked about a wire or component led to form a releasable electrical connection. The hook is spring biased in an insulating body and the hook is thus tensioned against the lead to assure the connection. It has also been suggested that instead of using an exposed wire that some form of a test terminal be incorporated into the board to which a different type of test probe or a different form of connector may be releasably attached in order to provide connection to the board at the specific location of the test terminal.

It is accordingly an object of the present invention to provide a test probe which has a probe end that is capable of being easily attached and removed from either a hookable conductor or a test terminal but yet which provides a reliable electrical connection thereto.

Another object of the present invention is to achieve the above object with a test probe that reduces the possibility of an inadvertent electrical connection to another portion of the board by enabling a user to minimize the extent of the exposed electrically conducting probe end.

A further object of the present invention is to provide a test probe and a test terminal in which the shape of the probe end normally exerts tension to maintain the electrical connection between the probe end and the test terminal when attached to the terminal but yet the probe end, if desired, may be maintained extended without tension.

Still another object of the present invention is to provide a test probe and test terminal that are relatively economical to manufacture, durable, quite resistant to maladroit operation and yet be used in a variety of different ways.

In carrying out the present invention, the test probe includes an elongate strip conductor formed of electrically conducting material, such as berylium copper. The strip conductor is enclosed in a hollow casing formed of three parts of electrical insulating material with there being an intermediate body, a cap positioned at one end and a barrel positioned at the other end of the body. These three casing pieces are spring urged apart to normally contain the complete extent of the conductor within the insulating casing. However, in use, the casing is shortened by telescoping either or both of the cap and barrel with respect to the intermediate body. Such telescoping exposes the probe end of the conductor to enable an electrical connection to be formed with a part of a printed circuit board and when the telescoping force is removed, the casing automatically minimizes the telescoping to provide a tension on the part and also to minimize the extent of the probe end that is exposed.

The conductor probe end is shaped to provide a hook at its end and contiguous therewith a portion having a somewhat cylindrical periphery but with a unitary protruding tongue. Thus, while releasable connection with the hook depends upon the spring tension in the casing to maintain frictional engagement, the connection with a test terminal having an aperture into which the cylindrical periphery of the probe is positioned, depends upon the tongue for maintaining the frictional engagement. Further, the test terminal is provided with cross apertures which enables it to receive the probe end from two directions and also presents a side wall portion which may be alternatively engaged by the probe end hook.

Other features and advantages will hereinafter appear.

In the drawing—

FIG. 4 is a view similar to FIG. 1 with portions broken away.

FIG. 5 is an elevation of the conductor assembly with the barrel positioned thereon.

FIG. 6 is a plan thereof.

FIG. 7 is an enlarged elevation of the probe end of the conductor.

FIG. 8 is a plan thereof.

FIG. 9 is an end view of the probe end.

FIG. 10 is an elevation of a test terminal of the present invention shown mounted in a printed circuit board.

FIG. 11 is a partial sectional view of the probe end being received within the terminal of FIG. 10.

FIG. 12 is a partial sectional view of the probe end being received transversely by the test terminal of FIG. 10.

FIG. 13 is a partial sectional view of the probe end being hooked to a sidewall of the test terminal.

FIG. 14 is a section of the body taken on the line 14—14 of FIG. 14.

Figure 1:
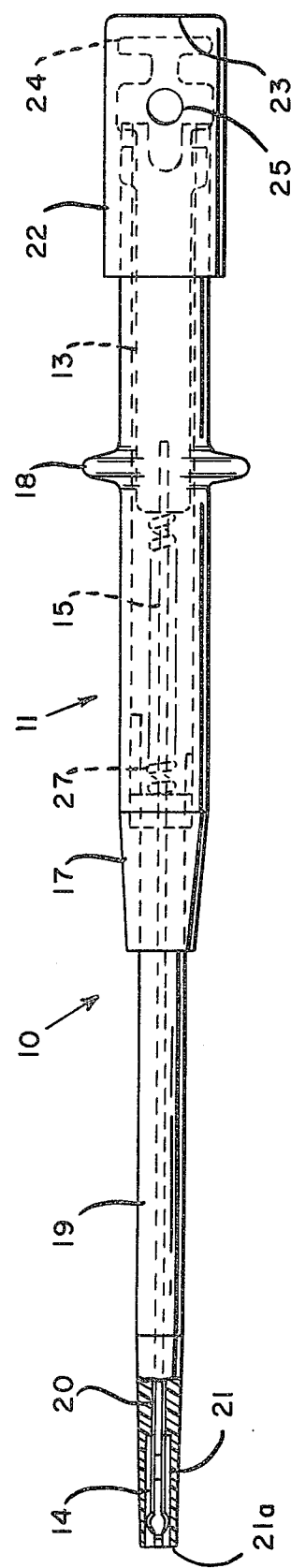
FIG. 1 is an elevation of the test probe of the present invention with portions broken away.

Referring to the drawing, the test probe of the present invention is generally indicated by the reference numeral 10 and includes a casing 11 that envelops a conductor 12. The conductor is formed of two individual pieces that are stamped from strip electrical conducting material, such as berylium copper, with the conductor terminal end piece being indicated by the reference numeral 13 and having the shape shown in FIGS. 5 and 6. The probe end piece of the conductor while shown completely in FIGS. 5 and 6, is partially shown enlarged in FIGS. 7, 8 and 9, and is indicated by the reference numeral 14. It includes an elongated tail 15 which fits within a groove 16 formed in the terminal end 13 and is secured thereat as by spot welding, soldering etc.

The casing 11 is formed of three parts molded of electrically insulating plastic material and includes a hollow intermediate body 17 formed with an external finger engaging peripheral ridge 18. A barrel 19 has the shape indicated and is hollow by reason of a slot 20 that is circular in cross-section and an enlarged cylindrical end recess 21. A cap 22 is cup-shaped to have a closed end 23 and internal slots 24 for receiving the peripheral edges of the corresponding portions of the terminal end 13. Further, the cap is formed with a through aperture 25 through which a lead wire 26 shown in dotted lines FIG. 2 for example, may pass while having its end electrically secured to the terminal end 13.

As shown in FIGS. 5 and 6, the test probe 10 is assembled by inserting the elongated tail 15 into the recess 21 of the barrel 19 until the probe end 14 is completely within the barrel. A spring 27 is then placed on the protruding portion of the tail and the tail is received within the longitudinal groove 16 formed in the conductor terminal end 13.

Welding or other securement is then employed to fasten the tail to the terminal end 13.

With the conductor assembly shown in FIGS. 5 and 6 being completed, the barrel 19 is then passed into the cap end of the body 17, end recess 21 first, until the barrel assumes the extended position shown in FIG. 1 where projecting ears 28 formed on the barrel abut against end 29 of diametrically opposite slots 30 formed internally in the body 17. The stripped end 26a of the lead wire 26 is then passed through the aperture 25 of the cap 22 and is further passed through an aperture 31 (FIG. 5) formed in the terminal end 13. The end 26a is then bent to be parallel with the terminal end 13 and secured thereto as by soldering as indicated by the reference numeral 32. The cap 22 is then positioned onto the body 17 by having the peripheral edges of the terminal end 13 such as indicated by the reference character 13a, inserted within the slots 24 formed internally in the cap with the lead wire 26 extending therefrom.

Figure 2:
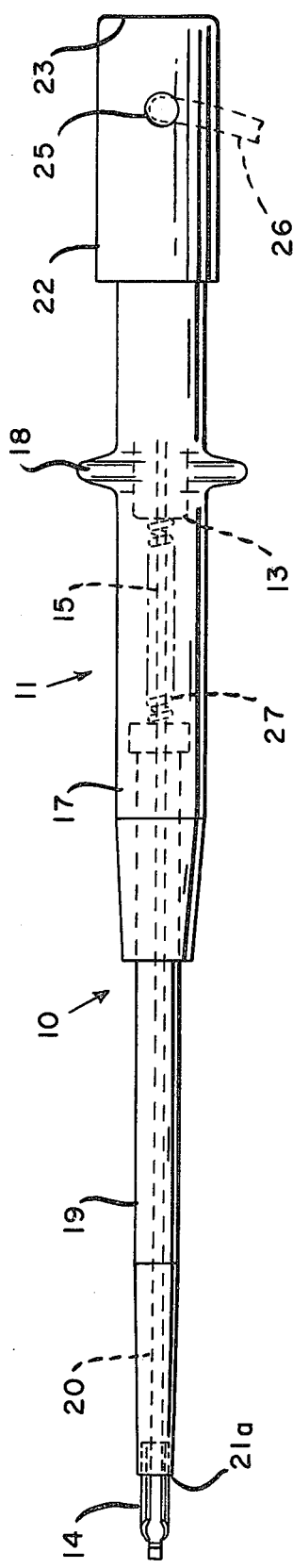
FIG. 2 is a view similar to FIG. 1 with the probe end being substantially exposed by telescoping of the barrel.

With the above construction, a force applied to the barrel 19 to effect its telescoping into the body 17 will expose the probe end 14 and compress the spring 27. Upon release of the telescoping force, the spring 27 will urge the barrel outwardly to the normal position insofar as possible, as shown in FIG. 1. The position of the parts caused by the essentially maximum telescoping of the barrel is shown in FIG. 2 while in FIG. 3, the parts are shown with a compressive force being applied to the end 23 of the cap 22 to cause the cap to telescope over the body 17 and partially project the probe end from the barrel without there being any telescoping of the barrel. Such a force also compresses the spring 27 and upon the release thereof, the parts insofar as possible will assume the position as shown in FIGS. 1 and 4. The telescoping force may be exerted by handling the two parts of the casing or by pushing on the end of the barrel with the aid of the ridge 18.

Referring to FIGS. 7, 8 and 9, the probe end 14 is stamped to have a hook 33 formed at one end and an intermediate semi-cylindrical portion 34. A tongue 35 is formed to outwardly arc beyond the normal periphery of the portion 34.

Figure 3:
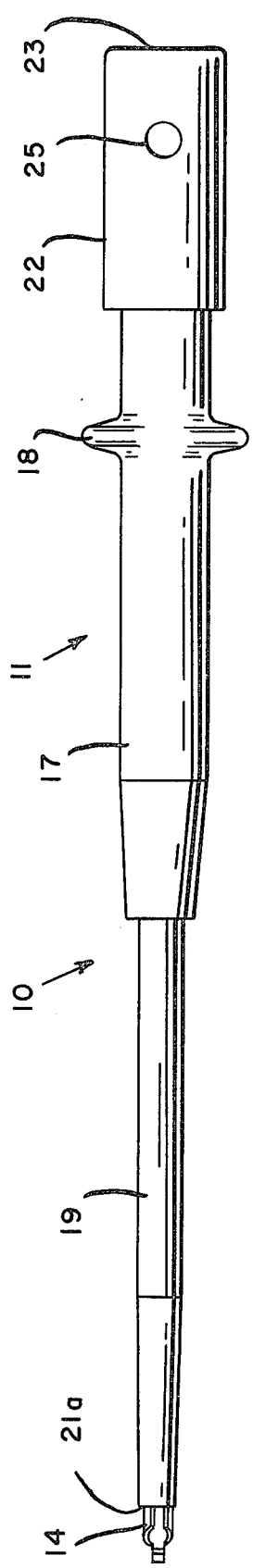
FIG. 3 is a view similar to FIG. 1 with the probe end being partially exposed by telescoping of the cap.

In use, the test probe of the present invention may be used as a conventional hook test probe by either telescoping the barrel as shown in FIG. 2 or telescoping the cap as shown in FIG. 3 to expose the hook 33 which may then be positioned around a wire or component part of printed circuit board. Upon release of the telescoping force, the spring 27 will cause the casing 11 to elongate until the end of the barrel engages the hooked wire or component part. Only the hook end of the conductor 12 will thus be exposed and the hooked connection will be maintained by the tension of the spring.

In addition to providing for the hooking of a wire or component part, the present invention is usable with a test terminal generally indicated by the reference numeral 36 and shown in FIG. 10. The terminal 36 is, for example, formed from metal rods on a screw machine to have an axial aperture 37 and a cross aperture 38, both of which have essentially the same diameter. The test terminal 36 further includes a base fomred with knurled portion 39 and a beveled end 40. The terminal 36 is pressed in a hole 41 formed in a printed circuit board 42 until the terminal abuts the periphery of the hole with the knurled portion 39 causing a press fit with the board. When the printed circuit board is soldered, solder is flowed as indicated by the reference numeral 43, to engage the beveled end 40 of the terminal to form an electrical connection between the terminal 36 and whatever portion of the board the solder 43 is connected to.

With a terminal 36 so interconnected with the board, the test probe 10 of the present invention may be easily connected thereto by aligning the test probe with for example the axial aperture 37 and then pushing on the ridge 18 to cause substantial part of the semi-cylindrical portion 34 to be positioned within the confines of the terminal. The confined part includes most of the tongue 35 which is pressed inwardly by the terminal to produce a tensional fit with the terminal as shown in FIG. 11. On the other hand as shown in FIG. 12, the probe end may instead be placed within the cross aperture 38 by aligning the probe end with the cross aperture 38 and pushing on the ridge 18 to again have the tongue 25 placed within the aperture to be tensioned by the terminal and assure an electrical connection with the terminal.

Rather than utilizing the apertures 37 and 38, the terminal 36 may be hooked, as shown in FIG. 13, by the hook engaging a side wall 44 formed between the apertures 37 or 38, the same as if the side wall 44 were a lead or component part.

In the embodiments shown in FIGS. 11, 12 and 13, the end 21a of the barrel will be caused by the spring 27 to abut the corresponding edges of the terminal to thereby minimize the extent of the probe end that is exposed.

In the previously described usage of the test probe, the spring 27 has exerted a tension to minimize the telescoping. However, if desired, the test probe of the present invention also enables the probe end to be maintained extended without tensioning. The interior end of the body 17 adjacent the ears 28 of the barrel is formed with diametrically opposite abutments 46 and 46', with the latter being longer than the former. The abutments define another pair of diametrically opposite slots 47, that are shorter than the slots 30. A user, by first telescoping the barrel into the body so that the ears 28 pass beyond the ends of abutments 46 may then rotate the barrel relative to the body ¼ of a turn and upon release, the ears will pass into the shorter slots 47 to have the probe end project without spring tensioning. The longer abutments 46' limit the twisting to only one direction for extension while twisting the barrel in the other direction after telescoping it so as to pass the ears beyond the ends of abutments 46, enables the ears to become aligned with the slots 30 and permits the spring 27 to return the barrel to its normal position where it completely encloses the probe end.

It will also be noted that the abutments 46 are sufficiently long to prevent the ears 28 from being displaced from the slots 30 when the probe end is inserted into an aperture 37 or 38 of a test terminal 36.

For retaining the conductor 12 within the body, the body has oppositely aligned slots 48 formed with the shape shown in FIG. 4 into which tangs 49 formed on the terminal end of the conductor enter. The slots 48 further have a reduced entrance portion 50 which while permitting the tangs 49 to be relatively easily placed within the slots, effectively lock the tangs therein. It is also noted that the slots 48 are somewhat elongate to enable movement of the conductor with respect to the body when the test probe is actuated by a telescoping force on the cap 22.

It will accordingly be understood that there has been disclosed a test probe for providing a releasable electrical connection to a portion of a printed circuit board. The probe permits the hooking of a wire or component with tension being applied during hooking to both assure the electrical connection and minimize the exposure of the electrical conductor to thereby avoid inadvertent contact with other portions of the board. The test probe moreover may be utilized with a test terminal with a connection being provided by insertion of the probe end into one of the apertures of the test terminal. After insertion, the electrical engagement is maintained with the terminal by tensioning of a tongue within the aperture. While both of the above uses may be had with a minimum exposure of the conductor, the probe also permits the probe end to be extended to a fixed position and maintain thereat without tensioning merely by a slight twisting of the barrel with respect to the body. Thus, the test probe of the present invention enables a user to select any one of a plurality of different ways for providing a releasable electrical connection to a printed circuit board.

Variations and modifications may be made within the scope of the claims and portions of the improvements may be used without others.

I claim:

1. A test probe for providing a releasable electrical connection to a conductor comprising an elongate conductor having a probe end and a terminal end, a casing normally enveloping the conductor, said casing consisting of a hollow intermediate body, a hollow barrel and a cap with each being formed from electrically insulating material, said barrel having a recess end for receiving the probe end and another end telescopingly movable within with respect to one end of the body, said cap being secured on the terminal end of the conductor and being telescopingly movable over with respect to the other end of the body, means for retaining the conductor in the casing for relative sliding movement with respect to the body and barrel and spring means engageable with the casing and the conductor for resisting telescoping movement of the barrel and cap with respect to the body.

2. The invention as defined in claim 1 in which the telescoping of the barrel produces sliding movement between the conductor and only the barrel to expose the probe end.

3. The invention as defined in claim 1 in which telescoping movement of the cap relatively moves the conductor with respect to both the barrel and body to expose the probe end.

4. The invention as defined in claim 1 in which the spring means is a compressionable spring positioned within the body and having one end engaging the other end of the barrel and its other end engaging the conductor for urging the conductor and barrel apart.

5. The invention as defined in claim 3 in which the another end of the barrel is received within the body, there are means for retaining the another end of the barrel telescoped within the body against the urgings of the spring means with said retaining means including ears carried by the another end of the barrel and shortened slots formed in the body into which the ears are received.

6. The invention is defined in claim 1 in which the probe end terminates in a curved element forming a hook.

7. The invention as defined in claim 6 in which the probe end includes an essentially semi-cylindrical portion formed with a part thereof positioned to protrude from the portion to form a deformable tongue.

8. The invention as defined in claim 7 in which there is a test terminal incorporable into a printed circuit board, said test terminal having at least one aperture shaped to receive the semi-cylindrical portion and cause tensioning of the tongue with the tensioning producing and maintaining an electrical connection between the conductor and the test terminal, in which there is another aperture formed in the test terminal to extend perpendicularly to the first mentioned aperture and in which is shaped to receive the semi-cylindrical portion and cause tensioning of the tongue and in which a side wall of the terminal between the two apertures is adapted to be engaged by the hook.

* * * * *